(12) United States Patent
Olsson et al.

(10) Patent No.: US 9,971,315 B2
(45) Date of Patent: May 15, 2018

(54) ELECTRONIC CIRCUIT WITH A CURRENT RIPPLE FILTER

(75) Inventors: Jörgen Olsson, Torslanda (SE); Mikael Appelberg, Göteborg (SE); Martin Svensson, Kärna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 755 days.

(21) Appl. No.: 14/385,330

(22) PCT Filed: Apr. 10, 2012

(86) PCT No.: PCT/EP2012/056445
§ 371 (c)(1),
(2), (4) Date: Sep. 15, 2014

(87) PCT Pub. No.: WO2013/152785
PCT Pub. Date: Oct. 17, 2013

(65) Prior Publication Data
US 2015/0061411 A1    Mar. 5, 2015

(51) Int. Cl.
*H02B 1/24*    (2006.01)
*H01H 35/00*    (2006.01)
(Continued)

(52) U.S. Cl.
CPC ............... *G05B 9/02* (2013.01); *H02J 1/02* (2013.01); *H02J 3/01* (2013.01); *H02M 1/15* (2013.01);
(Continued)

(58) Field of Classification Search
CPC ............ H03G 1/00; H02M 1/15; H02M 1/12; H02M 1/00; H02M 3/00; H02M 3/24; H02J 3/00; H02J 3/01; H02J 1/02; H02J 1/10; H02J 1/00; H03H 11/04; H05B 37/02; H05B 37/00; G05F 5/00
USPC .................. 307/131, 52, 49, 66, 64, 86, 82; 327/552, 559, 134; 330/127; 315/201, 315/291; 323/282, 299
See application file for complete search history.

(56) References Cited

U.S. PATENT DOCUMENTS

2005/0146906 A1 * 7/2005 Chao ..................... H02M 1/425
363/97
2008/0036440 A1 * 2/2008 Garmer ..................... G05F 1/67
323/299
(Continued)

FOREIGN PATENT DOCUMENTS

WO          200205412 A1    1/2002

*Primary Examiner* — Jared Fureman
*Assistant Examiner* — Jagdeep Dhillon
(74) *Attorney, Agent, or Firm* — Rothwell, Figg, Ernst & Manbeck, P.C.

(57) ABSTRACT

An electronic circuit comprising an ACRF comprising an active component, an energy storage unit, an input port and an output port. The electronic circuit comprises a control unit to control the ACRF. A detector detects a short circuit at the input port or the absence of an energy supply at the input port. The control unit controls the ACRF to function as an ACRF if the detector detects a power supply connected to the input port or that there is no short circuit at the input port, and controls the ACRF to stop functioning as an ACRF and to discharge energy from its energy storage unit to its output port if the detector detects a short circuit at the input port or no power supply connected to the input port.

5 Claims, 5 Drawing Sheets

(51) Int. Cl.
*H02H 3/00* (2006.01)
*H01H 47/00* (2006.01)
*G05B 9/02* (2006.01)
*H03G 1/00* (2006.01)
*H02J 1/02* (2006.01)
*H02J 3/01* (2006.01)
*H03H 7/01* (2006.01)
*H02M 1/15* (2006.01)

(52) U.S. Cl.
CPC ............ *H03G 1/00* (2013.01); *H03H 7/0107* (2013.01); *Y02E 40/40* (2013.01); *Y10T 307/826* (2015.04); *Y10T 307/865* (2015.04)

(56) References Cited

U.S. PATENT DOCUMENTS

| | | | | |
|---|---|---|---|---|
| 2011/0109159 A1* | 5/2011 | Davis | ........................ | H02J 1/02 307/52 |
| 2011/0309759 A1* | 12/2011 | Shteynberg | ........ | H05B 33/0815 315/201 |
| 2011/0316508 A1* | 12/2011 | Cheng | ..................... | H02M 1/14 323/282 |
| 2012/0313701 A1* | 12/2012 | Khlat | ..................... | H02M 3/07 330/127 |

* cited by examiner

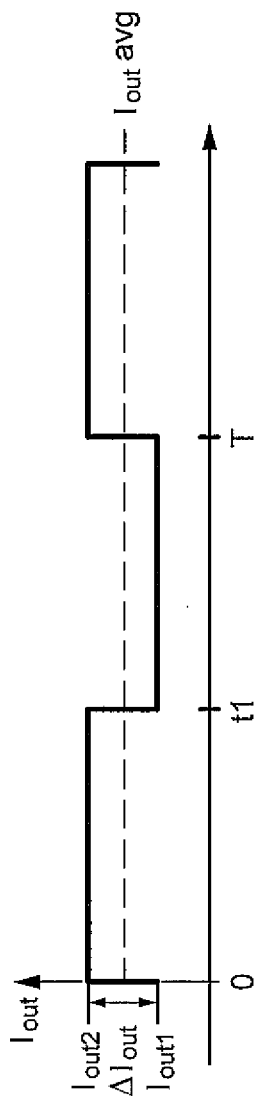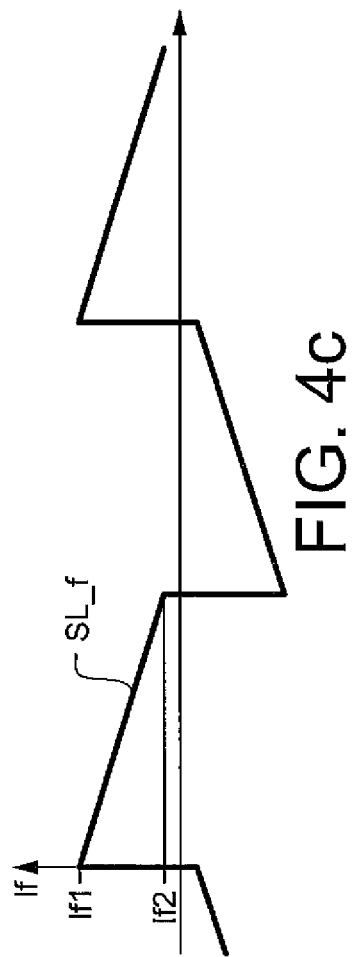

ELECTRONIC CIRCUIT WITH A CURRENT RIPPLE FILTER

CROSS REFERENCE TO RELATED APPLICATION(S)

This application is a 35 U.S.C. § 371 National Phase Entry Application from PCT/EP2012/056445, filed Apr. 10, 2012, designating the United States, the disclosure of which is incorporated herein in its entirety by reference.

TECHNICAL FIELD

The present invention discloses an electronic circuit with a current ripple filter.

BACKGROUND

So called power input protection and filters are important components in Printed Board Assemblies, PBAs, and serve to protect a load which is arranged on or connected to the PBA from power surges and other variations in the input current to the load, as well as serving to protect the load from power outages.

Known technologies for power input protection and filters include Passive Current Ripple Filters, PCRFs, usually combined with Passive Hold-up circuits which mainly serve to preserve the power supply to the load.

Known PCRFs usually comprise LC-circuits. A drawback with this is that the inductance as well as the capacitance of the LC-circuit will vary due to aging and temperature changes, so that the capacitors and inductances used in the LC-circuit must be over-dimensioned in order to ensure good performance over the entire lifetime of the PCRF, which will lead to large components being used, something which will consume surface area on the PBA, which is undesired.

Regarding known Passive Hold-Up circuits, since such circuits are required to be able to supply large currents in the event of a power outage, they will need to have rather large capacitances, which can be accomplished in one of two ways (or in combinations of those two ways): either a large amount of capacitors, each with a low capacitance can be used, which will consume a rather large surface area on the PBA, or a smaller amount of capacitors with a large capacitance can be used, which will consume less surface area on the PBA, but which in the other hand will lead to an increased height of the PBA, which naturally is also undesired.

SUMMARY

It is a purpose of the invention to obtain a design which obviates at least some of the disadvantages of known art in the field of power input protection and filters.

This purpose is addressed by means of an electronic circuit which comprises an active current ripple filter, an ACRF. The ACRF comprises one or more active components and an energy storage unit, and also comprises an input port and an output port.

In addition, the electronic circuit also comprises a control unit connected to and arranged for the control of the ACRF. The electronic circuit further comprises a first detector connected to the control unit and arranged to detect a short circuit at the ACRF's input port or the absence of an energy supply at the ACRF's input port. The control unit is arranged to control the ACRF to function as an ACRF if the first detector detects that there is a power supply connected to the ACRF's input port and that there is no short circuit at the ACRF's input port, and to control the ACRF to stop functioning as an ACRF and to discharge energy from its energy storage unit to its output port if the first detector detects that there is a short circuit at the ACRF's input port or that there is no power supply connected to the ACRF's input port.

By means of the electronic circuit described above, a number of advantages are obtained:
Improved control of the Current Ripple Filter and of the Hold-up functionality by utilization of active regulation, i.e. the use of an ACRF and its control unit control.
The Current Ripple Filter and the Hold-up functionality are combined in a manner which allows them to be realized with a minimal number of components, thereby decreasing board-area and height.

In embodiments, the electronic circuit further comprises a second detector for measuring the amplitude of a current at the ACRF's input port. The second detector is connected to the control unit, and the control unit is arranged to control the level of a current at the ACRF's output port by means of the measurements from the second detector when the ACRF is controlled to function as an ACRF.

BRIEF DESCRIPTION OF THE DRAWINGS

The invention will be described in more detail in the following, with reference to the appended drawings, in which FIGS. 3 and 4 show examples of the function of the electronic circuit.

DETAILED DESCRIPTION

Figure 1:
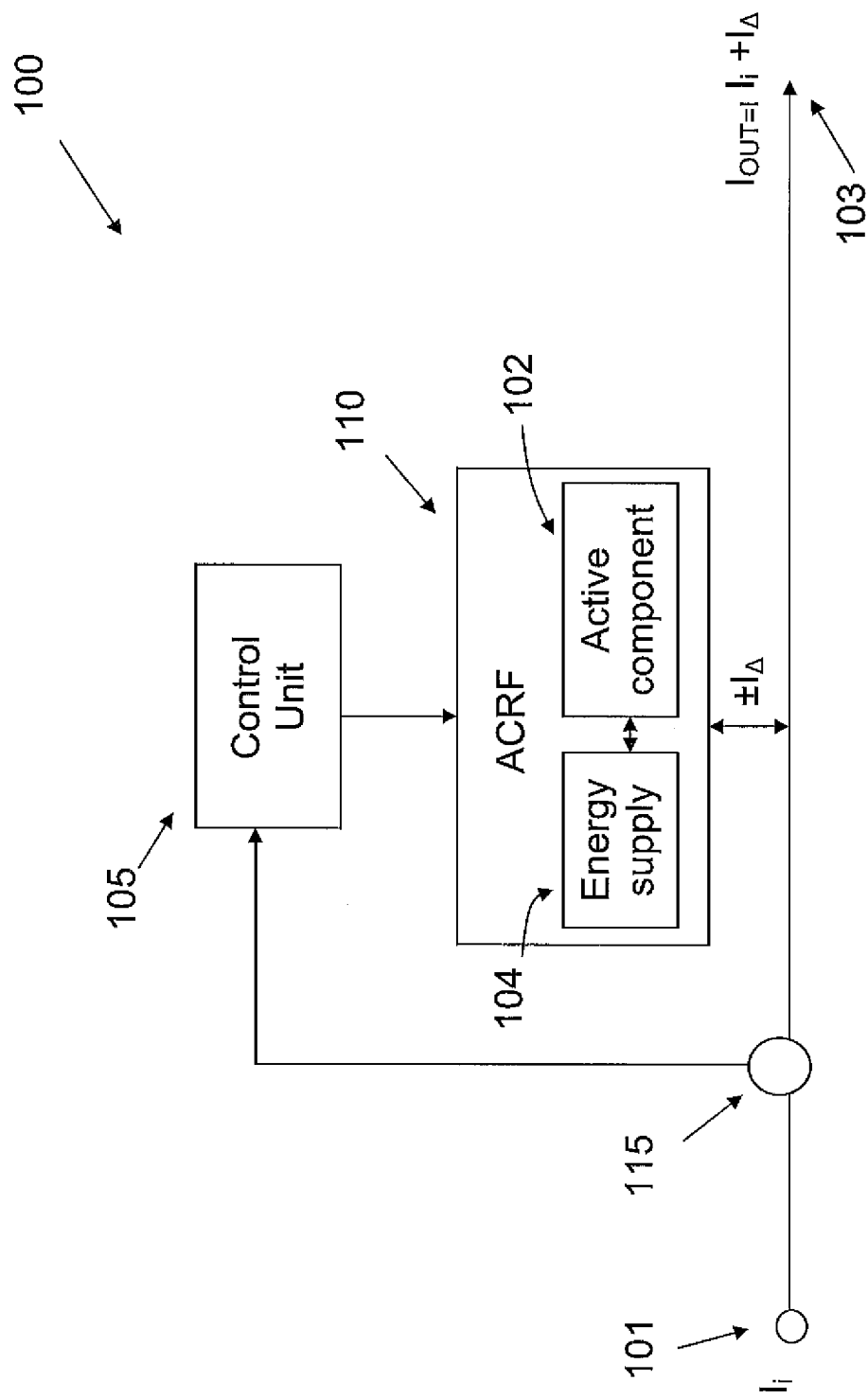
FIGS. 1 and 2 show basic block diagrams of embodiments of an electronic circuit.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

FIG. 1 shows a symbolic block diagram of a basic embodiment of an electronic circuit 100. The electronic circuit 100 comprises an input port 101 for an input current $I_i$ (and thereby also for an input voltage $V_i$) and an output port 102 for an output current $I_{out}$ (and thereby also for an output voltage $V_{out}$) from the electronic circuit 100.

As is also shown in FIG. 1, the electronic circuit 100 further comprises an active current ripple filter, ACRF 110, for filtering the level of the output current $I_{out}$, as well as the output voltage $V_{out}$. The filtering of the level of $I_{OUT}$ is done by means of adding or "subtracting" a current $I_A$, so that the total output current from the electronic circuit 100 becomes $O_{OUT} \pm I_A$, as is also shown in FIG. 1. As indicated in FIG. 1, the ACRF 110 comprises one or more active components 102. Examples of active components include transistors and Integrated Circuits in general. In addition, the ACRF 110 also comprises an energy supply 104, usually in the form of a capacitor which can be charged by the input current $I_i$, thereby making $I_A$ negative. The energy supply 104 may also be used in order to increase the output current by means of releasing energy from it, so that $I_A$ becomes positive.

There is also comprised a Control Unit 105 in the electronic circuit 100, arranged to control the function of the ACRF 110.

In addition, the electronic circuit 100 comprises a first detector 115 which is arranged to detect a short circuit at the input port 101 and to also detect the absence of an energy supply unit at the input port 101. The first detector is connected to the control unit 105, so that the control unit 105 can notice a short circuit at the input port 101 as well as the absence of an energy supply unit at the input port 101.

If the detector 115 detects a short circuit at the input port 101 or the absence of an energy supply unit at the input port 101, the control unit 105 is arranged to control the ACRF to stop functioning as an ACRF, i.e. to stop regulating the level of the output current at the input port 101, and to instead start discharging energy from the energy supply 104 to the output port 102. If, on the other hand the detector 115 detects that there is no short circuit at the input port 101 and that there is an energy supply connected to the input port 101, the control unit 105 is arranged to control the ACRF to function as an ACRF.

Thus, for example, if there has been a short circuit or/and an energy supply has been absent at the input port 101, and the ACRF has thus been controlled to discharge energy from the energy supply, when there is no longer a short circuit at the input port 101 and there is an energy supply connected to the input port 101, the control unit 105 is arranged to control the ACRF to stop discharging energy from its energy supply 104, and to resume its ACRF function again.

The discharge of energy from the energy supply 104 can also be seen as a so called Automatic Hold Up function, AHU. Thus, the control unit 105 can be seen as "toggling" the ACRF between an ACRF function and an AHU function, depending on what the first detector 115 detects. For this reason, the control unit 105 can also be seen as a so called digital switch-mode controller, a DSMC.

Figure 2:
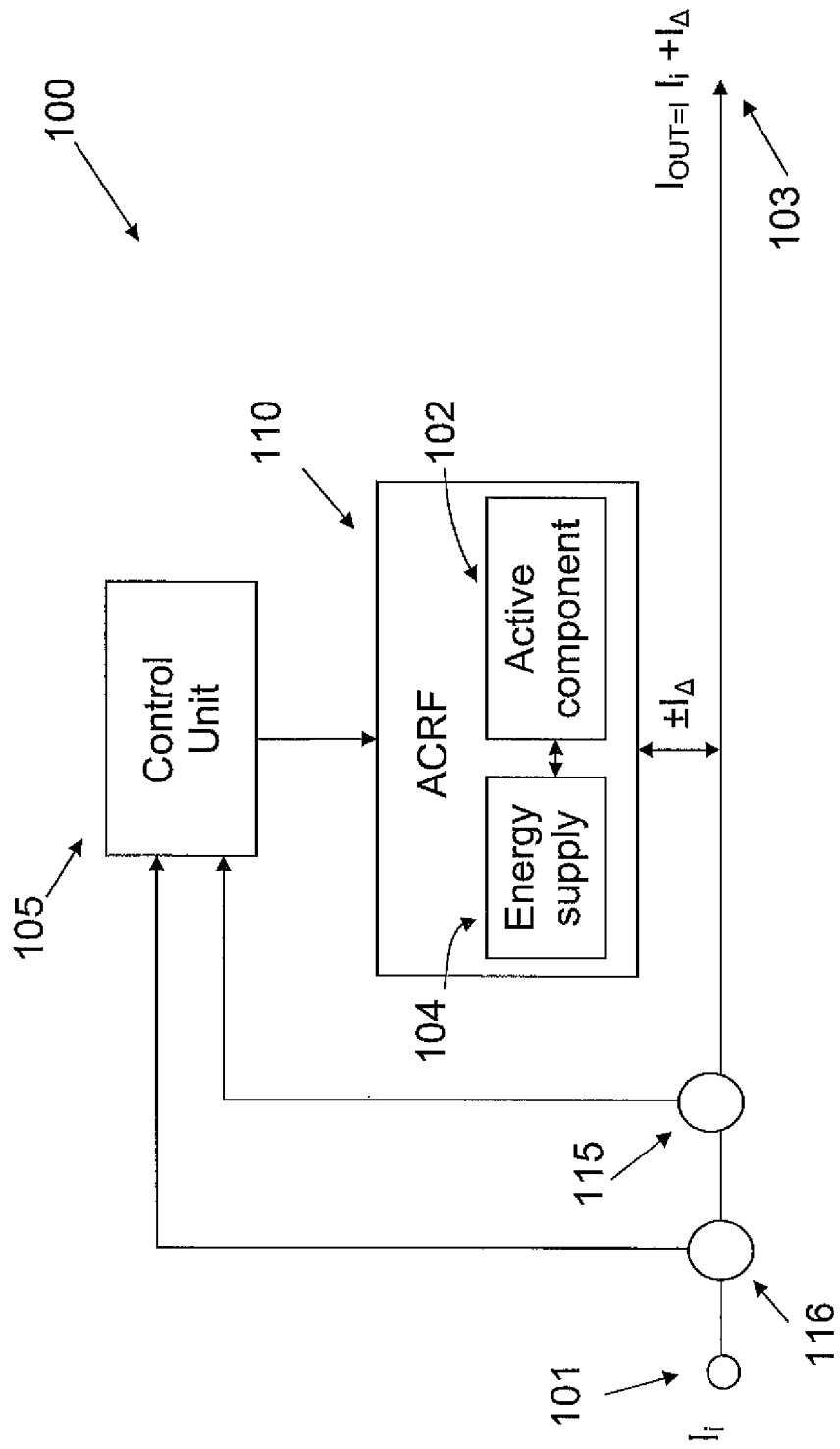

FIG. 2 shows a further embodiment 200 of the electronic circuit 100 of FIG. 2. In the embodiment 200, the electronic circuit 200 also comprises a second detector 116, which is arranged to measure the amplitude of a current at the ACRF's 110 input port 101. In addition, the second detector 116 is also connected to the control unit 105, and the control unit 105 is arranged to control the level of a current at the ACRF's output port 102 by means of the measurements from the second detector 116 when the ACRF 110 is controlled by the control unit 105 to function as an ACRF.

Below, with reference to FIG. 3, an example of how the voltage over the capacitor 104 varies during different modes of the ACRF 110 will be described, the voltage being labeled Cy. The energy supply 104 will in the following also be referred to as a capacitor, since this is a common embodiment of the energy supply 104.

Figure 3:
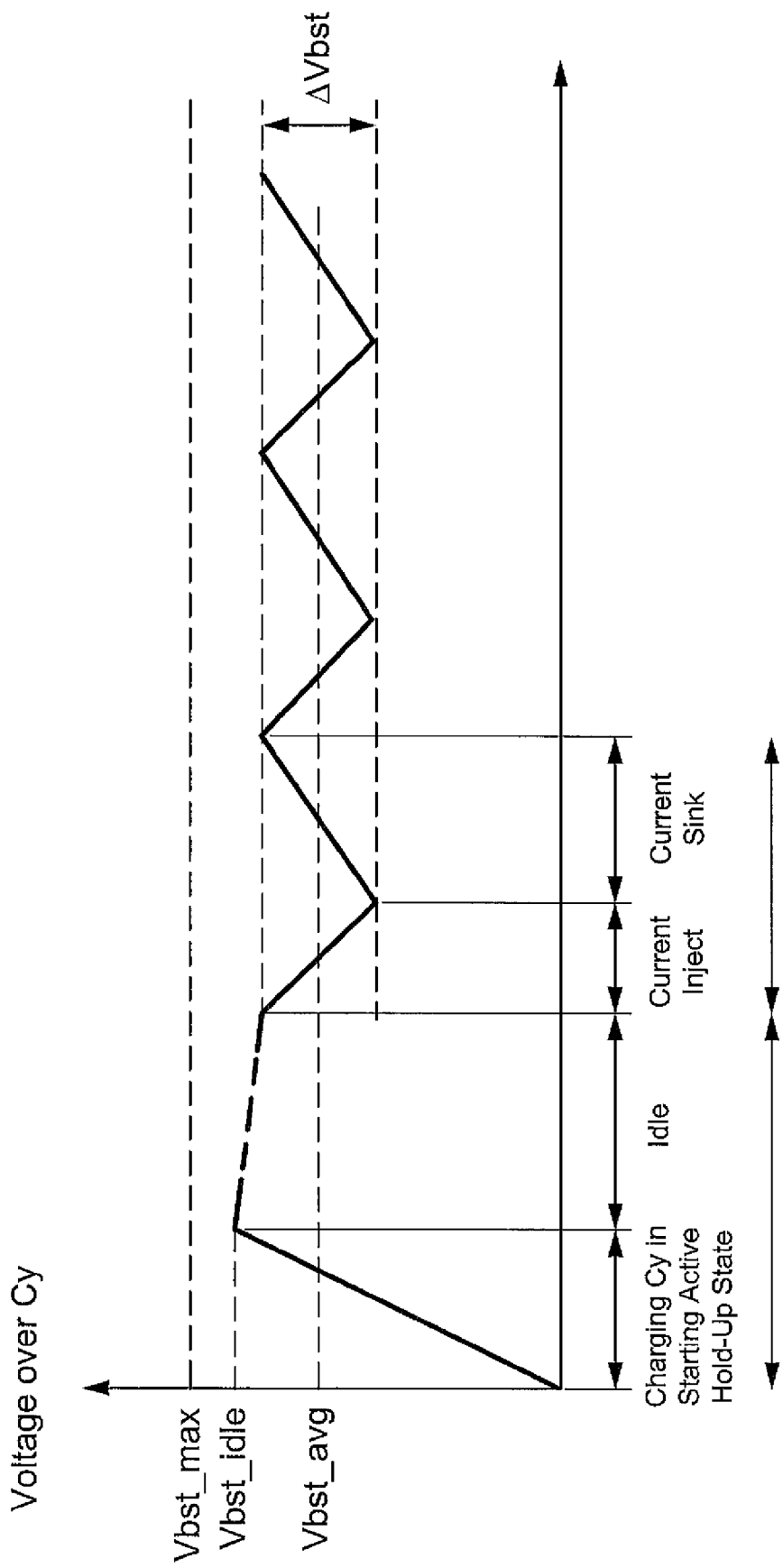

Initially, when the electronic circuit 100 is started, the capacitor 104 is charged with energy, as shown in FIG. 3 with the label "Charging". This phase can also be seen as a start-up mode of the ACRF 110.

As shown in FIG. 3, in the Start-up mode, the voltage over the capacitor 104 is ramped up from the input voltage $V_{in}$ at the input port 101 to a level called Vbst_idle, which depends on the ACRF components and which is higher than $V_{in}$. The "ramping up" of the voltage over the capacitor 104 to Vbst_idle is controlled by the Control Unit 105.

When the level Vbst_idle is reached, the Control Unit 105 will strive to maintain the level Vbst_idle over the capacitor 104, which is shown in FIG. 3 with the label "Idle". There may be energy (inadvertently) discharged from the capacitor 104, but the Control Unit 105 will attempt to hold the voltage level over the capacitor 104 at a constant level which here is referred to as the Vbst_avg level. This can also be seen as maintaining the DC-level of the voltage over the capacitor 104 at a certain level, i.e. Vbst_avg.

The Control Unit 105 is arranged to optimize the Vbst_avg level so that as much energy as possible is stored at any time in the case that the ACRF needs to start functioning as an AHU. This is done by increasing the level Vbst_avg as much as possible without going above a maximum level which here and in FIG. 3 is referred to as Vbst_max and which is determined by the voltage rating of the ACRF components. In embodiments, the Control Unit 105 attempts to keep the voltage over the capacitor 104 at a level higher than the input voltage $V_{in}$ at the input port 102. The benefit of a higher Vbst_avg voltage than $V_{in}$ is that a higher voltage means that the capacitor 104 can store more energy per volume, thus a smaller sized capacitor can be chosen while still fulfilling the requirements for AHU.

Thus, the voltage Cy is ramped up from 0 V to the level Vbst_idle, following which the ACRF is idle, i.e. no energy needs to be discharged from the capacitor 104 in order for the ACRF to carry out its filter function. During the "idle period", a slow discharge of the energy stored in the capacitor 104 will naturally take place, as shown in FIG. 3.

In the example shown in FIG. 3, following the idle period, the filter function of the ACRF necessitates an injection of current from the capacitor 104 to a load connected to the ACRF, shown with the label "Current inject" in FIG. 3. Following this, the filter function (again as an example) then leads to the need for a "current sink" from the same load, which is also shown in FIG. 3. As is shown in FIG. 3, the filter function of the ACRF then has alternating "inject" and "sink" periods, but the Control Unit 105 attempts to keep the voltage over the capacitor 104 at the average level Vbst_avg.

As mentioned before, the first detector 115 is arranged to detect a short circuit at the input port 101 or the absence of an energy supply unit at the input port 101, and if this s the case (i.e. either of these two conditions) the Control Unit 105 then "toggles" the ACRF to act as an AHU instead.

In this case, i.e. "AHU function", the Control Unit 105 will attempt to control the ACRF to maintain the output voltage $V_{OUT}$ at the output port 102 of the ACRF 110, which will be done by discharging energy from the capacitor 104.

If the conditions for controlling the ACRF to act as an AHU disappear before the average level Vbst_avg of the voltage over the capacitor 104 falls below a certain minimum level Uinmin, the Control Unit 105 will either ramp up the voltage over the capacitor 104 as was shown in FIG. 3, or it will start so called "trickle charging" of the energy stored in the capacitor 104, i.e. injecting energy into the capacitor 104 slowly, and possibly over two or more non-consecutive periods of time. If the voltage level over the capacitor 104 equals (or exceeds) the voltage at the output port 102, the ACRF will be controlled to act as an AHU.

The filter function of the ACRF will now be described in more detail, with reference to FIGS. 1, 2 and 4. FIGS. 1 and 2 show three currents in the electronic circuit 100: A first current, denoted $I_i$ is the input current at the input port 101 of the ACRF 110 and a second current denoted $I_{out}$ is the output current from the output port 102 of the ACRF 110. A third current, denoted $I_A$, is a current which is generated by the ACRF as such, and the value of $I_A$ can be either positive or negative. The current $I_A$ is regulated by the Control Unit 105 in a manner which will be explained in more detail later.

As has been explained previously, $I_{AOUT}=I_i+I_A$. By means of this equation, $I_A$ can be used to regulate $I_i$ when/if $I_{OUT}$ varies, so that $I_i$ is kept stable.

In order to illustrate the function of the ACRF 110 as an ACRF, i.e. not as an AHU, FIG. 4 comprises three graphs, 4a, 4b and 4c, one for each of the currents $I_{AOUT}$, $I_i$, and $I_A$, which graphically illustrate the principle that $I_{AOUT}=I_i+I_A$. Accordingly, if the values of the graphs in FIGS. 4b and 4c are added and the result is compared to the graph of 4a, one can see that $I_{AOUT}=I_i+I_A$.

Since, as noted previously, $I_{OUT}=I_i+I_A$, variations in $I_{out}$ which would cause corresponding variations in $I_i$ can be compensated for by varying $I_A$ "inversely" to the variations in $I_i$, so that $I_{out}$ is kept stable and within the limits $I_{out2}$–$I_{out1}$.

Figure 5:
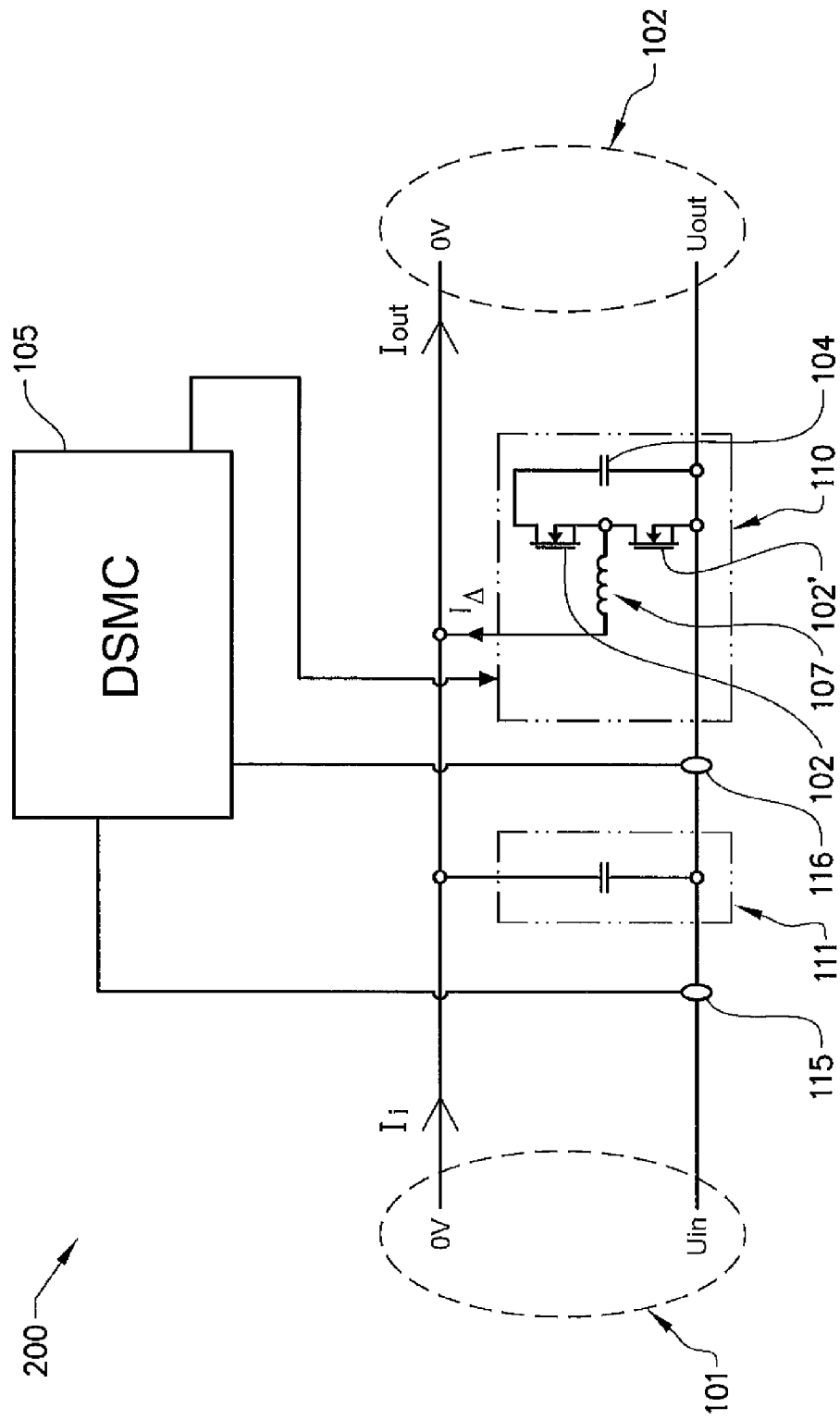
FIG. 5 shows a detailed embodiment of an electronic circuit.

FIG. 5 shows a more detailed embodiment of the electronic circuit 200. As shown in the more detailed embodiment of FIG. 5, the input port 101 of the ACRF 110 actually comprises two connections between which a voltage $U_{in}$ may be applied, with a corresponding input current $I_i$. Similarly, the output port 102 of the ACRF 110 also actually comprises two connections, between which a voltage $U_{out}$ appears, along with a corresponding output current $I_{out}$.

In addition, an embodiment of the ACRF 110 is shown in FIG. 5: in this particular embodiment, the ACRF 110 comprises two FET transistors 102, 102', where the drain of transistor 102' is connected to the source of transistor 102. The two transistors 102, 102', are also connected in parallel with a capacitor 104. It is the capacitor 104 that acts as an energy storage unit when the ACRF 110 is controlled to act as an ACRF, and which is used to discharge energy in the "AHU mode" of the ACRF 110.

The ACRF 110 also comprises an inductor 107, which at one end is connected between the drain of transistor 102' and the source of transistor 102. As shown in FIG. 5, the other end of the inductor 107 is connected to one of the two connections which form the output port 102. Since the transistor 102' is connected with its source to the other of the two connections which form the output port 102. This corresponds to a synchronous boost converter where the average voltage of the pulses in the switch node corresponds to the output voltage. By changing the duty cycle, the average voltage value is changed and a current is built up in the choke.

FIG. 5 also shows the first detector 115, which in general terms is what is known as an active OR-ing detector, and which may suitably be designed as a voltage level detector In addition, the second detector 116 is also shown, and this detector may suitably be designed as a current level detector. In FIG. 5, there is also comprised a capacitor 111, which serves as a ripple filter for frequencies which are above a frequency which otherwise could not have been have handled by the ACRF.

The control unit 105 is also shown in FIG. 5, but with only a symbolic connection to the ACRF 110 shown, i.e. not all control connections are shown, such as, for example, control connections to the transistors 102, 102' and to the capacitor 104.

Three cases can be discerned for the ACRF:
1) The control unit 105 controls the ACRF to "inject" current (see FIG. 3), i.e. $I_A$ is controlled to be positive. This is the case if $I_i$ is detected by the control unit 105 to increase at more than a certain rate, in which case the control unit 105 increases the duty cycle of the transistor 102, and decreases the duty cycle of the transistor 102', which causes the current from the ACRF, through the inductor 107, to increase, thereby compensating for the increased $I_{OUT}$.
2) The control unit 105 controls the ACRF to "sink" current (see FIG. 3), i.e. $I_A$ is controlled to be negative. This is the case if $I_i$ is detected by the control unit 105 to decrease at more than a certain rate, in which case the control unit 105 decreases the duty cycle of the transistor 102, and increases the duty cycle of the transistor 102', which causes the current into the ACRF, through the inductor 107, to increase, thereby compensating for the decreased $I_{OUT}$.
3) The control unit 105 controls the ACRF to act as an AHU instead of as an ACRF. In this case, the control unit 105 monitors the output voltage $U_{OUT}$ from the ACRF (now acting as an AHU), and controls the duty cycle of the transistor 102 to cause the output voltage $U_{OUT}$ to maintain its initial value (i.e. the value when the AHU mode was entered) until the value over the capacitor 104 is equal to $U_{OUT}$. When the voltage over the capacitor 104 equals the output voltage 102 the AHU will function as a passive holdup.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. An electronic circuit comprising:
an active current ripple filter (ACRF), the ACRF comprising one or more active components and an energy storage unit, and an input port and an output port,
a control unit connected to and arranged for the control of the ACRF,
a first detector connected to the control unit and arranged to detect a short circuit at the ACRF's input port or the absence of an energy supply at the ACRF's input port,
the control unit being arranged to control the ACRF to function as an ACRF if the first detector detects that there is a power supply connected to the ACRF's input port or that there is no short circuit at the ACRF's input port, wherein functioning as an ACRF means regulating an output current level at the input port,
the control unit being arranged to control the ACRF to stop functioning as an ACRF and to discharge energy from its energy storage unit to its output port if the first detector detects that there is a short circuit at the ACRF's input port or that there is no power supply connected to the ACRF's input port,
wherein the energy storage unit includes a capacitor,
the ACRF further comprising a first transistor and a second transistor connected in parallel with the capacitor.

2. The electronic circuit of claim 1, further comprising a second detector for measuring an amplitude of a current at the ACRF's input port, said second detector being connected to the control unit, the control unit being arranged to control the level of a current at the ACRF's output port based on the measurements from the second detector when the ACRF is controlled to function as an ACRF.

3. An electronic circuit comprising:

an input port comprising two connections between which a voltage may be applied;

an output port comprising two connections between which a voltage may appear;

an active current ripple filter (ACRF), the ACRF including:

- a first FET transistor and a second FET transistor, wherein a drain of the first FET transistor is connected to a source of the second FET transistor;
- an energy store capacitor, wherein the first and second FET transistors are connected in parallel to the energy store capacitor; and
- an inductor having first and second ends, wherein the first tend of the inductor is connected between the drain of the first FET transistor and the source of the second FET transistor and the second end of the inductor is connected to one of the two connections of the output port;

a first detector for detecting voltage, the first detector located between the input port and the ACRF;

a second detector for detecting current, the second detector located between the first detector and the ACRF;

a ripple filter capacitor located between the first detector and the second detector and for filtering frequencies above a threshold frequency; and a digital switch-mode controller (DSMC) connected to the ACRF, wherein the DSMC is configured to:

1) control the ACRF to inject current if a current at the input port is detected to increase at more than a first rate;
2) control the ACRF to sink current if the current at the input port is detected to decrease at more than a second rate; and
3) control the ACRF to act as an Automatic Hold Up (AHU) instead of as an ACRF if the first detector detects that there is a short circuit at the ACRF's input port or that there is no power supply connected to the ACRF's input port is detected.

4. The electronic circuit of claim 3, wherein the control unit is configured to inject current by increasing a duty cycle of the second FET transistor and decreasing a duty cycle of the first FET transistor, thereby causing current from the ACRF, through the inductor, to increase.

5. The electronic circuit of claim 3, wherein the control unit is configured to sink current by decreasing a duty cycle of the second transistor and increasing a duty cycle of the first transistor, thereby causing current into the ACRF, through the inductor, to increase.

* * * * *